United States Patent
Okada et al.

(10) Patent No.: US 9,659,795 B2
(45) Date of Patent: May 23, 2017

(54) FOREIGN MATTER REMOVAL DEVICE AND FOREIGN MATTER REMOVAL METHOD

(75) Inventors: Akira Okada, Tokyo (JP); Takaya Noguchi, Tokyo (JP); Hajime Akiyama, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 888 days.

(21) Appl. No.: 13/617,215

(22) Filed: Sep. 14, 2012

(65) Prior Publication Data

US 2013/0192630 A1     Aug. 1, 2013

(30) Foreign Application Priority Data

Jan. 27, 2012     (JP) ................................. 2012-015276

(51) Int. Cl.
  *H01L 21/67*     (2006.01)
(52) U.S. Cl.
  CPC ............................ *H01L 21/67028* (2013.01)
(58) Field of Classification Search
  CPC .... B08B 6/00; B08B 1/00; B08B 1/04; B08B 7/0028
  USPC ......................................................... 15/1.51
  See application file for complete search history.

(56) References Cited

U.S. PATENT DOCUMENTS

| | | | | |
|---|---|---|---|---|
| 5,758,776 A | * | 6/1998 | Slocum | H05K 13/0084 206/714 |
| 2001/0030144 A1 | * | 10/2001 | Nemoto | B65D 71/70 206/725 |
| 2009/0250077 A1 | | 10/2009 | Harano et al. | |
| 2011/0108056 A1 | * | 5/2011 | Ishizawa | B08B 6/00 134/1 |

FOREIGN PATENT DOCUMENTS

| | | |
|---|---|---|
| CN | 101223637 A | 7/2008 |
| JP | S58-51522 A | 3/1983 |
| JP | S59-12770 A | 1/1984 |

(Continued)

OTHER PUBLICATIONS

The First Office Action issued by Chinese Patent Office on Mar. 20, 2015, which corresponds to Chinese Patent Application No. 201210502574.X and is related to U.S. Appl. No. 13/617,215; with English language partial translation.

*Primary Examiner* — Larry E Waggle, Jr.
*Assistant Examiner* — Stephanie Berry
(74) *Attorney, Agent, or Firm* — Studebaker & Brackett PC

(57) ABSTRACT

A device includes a jig having a plate with through-holes formed therein and also having a frame formed on the plate so as to be able to accommodate a plurality of semiconductor chips in spaced relationship, a foreign matter capture member having a first charge section with a first flat surface and a second charge section with a second flat surface, the second charge section being insulated from the first charge section, charging means for positively charging the first flat surface and negatively charging the second flat surface, and sliding means for causing either the jig or the foreign matter capture member to slide relative to the other in such a manner that the through-holes of the jig are spaced a predetermined distance from the first and second flat surfaces. The through-holes are formed in different regions defined and surrounded by the frame.

9 Claims, 6 Drawing Sheets

(56) References Cited

FOREIGN PATENT DOCUMENTS

| | | |
|---|---:|---:|
| JP | S64-1237 A | 1/1989 |
| JP | H4-115544 A | 4/1992 |
| JP | H4-352677 A | 12/1992 |
| JP | H8-203851 A | 8/1996 |
| JP | H11-87457 A | 3/1999 |
| JP | 2002-362679 A | 12/2002 |
| JP | 2011-99156 A | 5/2011 |
| KR | 10-2007-002923 A | 2/2007 |

* cited by examiner

| |  |
|---|---|
| air | |
| asbestos | |
| glass | |
| mica | |
| nylon | |
| lead | + ↑ |
| silk | |
| aluminium | |
| paper | |
| copper | |
| cotton | |
| gum | |
| nickel | |
| tin, silver | |
| sulfur | ↓ |
| rayon | − |
| polyester | |
| urethane | |
| polyethylene | |
| vinyl | |
| fluororesin | |

FOREIGN MATTER REMOVAL DEVICE AND FOREIGN MATTER REMOVAL METHOD

BACKGROUND OF THE INVENTION

Field of the Invention

The present invention relates to a foreign matter removal device and foreign matter removal method for removing foreign matter adhering to semiconductor chips.

Background Art

Japanese Laid-Open Patent Publication No. S58-51522 discloses a technique for removing foreign matter adhering to articles. These articles are placed on a conveyor and passed through a tunnel-like charged structure so that foreign matter adhering to the articles is attracted and adhered to the charged structure.

Japanese Laid-Open Patent Publication No. H11-87457 discloses a method wherein charged foreign matter is attracted and adhered to a plate-like member of a transfer arm by applying to the transfer arm a voltage of opposite polarity to that of the foreign matter.

Japanese Laid-Open Patent Publication No. 2011-99156 discloses a method wherein charged foreign matter is attracted toward and adhered to insulator layers by applying positive and negative voltages to electrodes.

In the manufacture of semiconductor chips, foreign matter generated during manufacturing and dicing processes adheres to the side and bottom surfaces of the chips. It is necessary to remove such foreign matter in order to increase yield. However, the technique disclosed in the above-cited Publication No. S58-51522 has not been able to remove foreign matter on the side and bottom surfaces of semiconductor chips, since the entire bottom surfaces of the chips are in contact with the conveyor. Further, the technique disclosed in the above-cited Publication No. H11-87457 has not been able to remove foreign matter on the side surfaces of semiconductor chips. The technique disclosed in the above-cited Publication No. 2011-99156 has been found disadvantageous in that the removed foreign matter might adhere to the semiconductor chips again.

SUMMARY OF THE INVENTION

The present invention has been made to solve the foregoing problems. It is, therefore, an object of the present invention to provide a foreign matter removal device and foreign matter removal method capable of removing foreign matter on the side and bottom surfaces of semiconductor chips.

The features and advantages of the present invention may be summarized as follows.

According to one aspect of the present invention, a foreign matter removal device includes a jig having a plate with through-holes formed therein and also having a frame formed on the plate so as to be able to accommodate a plurality of semiconductor chips in spaced relationship, a foreign matter capture member having a first charge section with a first flat surface and a second charge section with a second flat surface, the second charge section being insulated from the first charge section, the first and second flat surfaces constituting a single flat surface, charging means for positively charging the first flat surface and negatively charging the second flat surface, and sliding means for causing either the jig or the foreign matter capture member to slide relative to the other in such a manner that the through-holes of the jig are spaced a predetermined distance from the first and second flat surfaces, wherein the through-holes are formed in different regions defined and surrounded by the frame.

According to another aspect of the present invention, a method of removing foreign matter, includes a step of mounting a plurality of semiconductor chips on a plate of a jig in such a manner that bottom surfaces of the semiconductor chips are exposed through through-holes formed in the plate, the jig having a frame formed on the plate so as to be able to accommodate the plurality of semiconductor chips in spaced relationship, a charging step of, by charging means, positively charging a first flat surface of a first charge section and negatively charging a second flat surface of a second charge section insulated from the first charge section, and a sliding step of, after the charging step, causing either the jig or the first and second flat surfaces to slide relative to the other by sliding means in such a manner that the bottom surfaces of the semiconductor chips face and are spaced a predetermined distance from the first and second flat surfaces.

Other and further objects, features and advantages of the invention will appear more fully from the following description.

DETAILED DESCRIPTION OF THE PREFERRED EMBODIMENTS

First Embodiment

Figure 1:
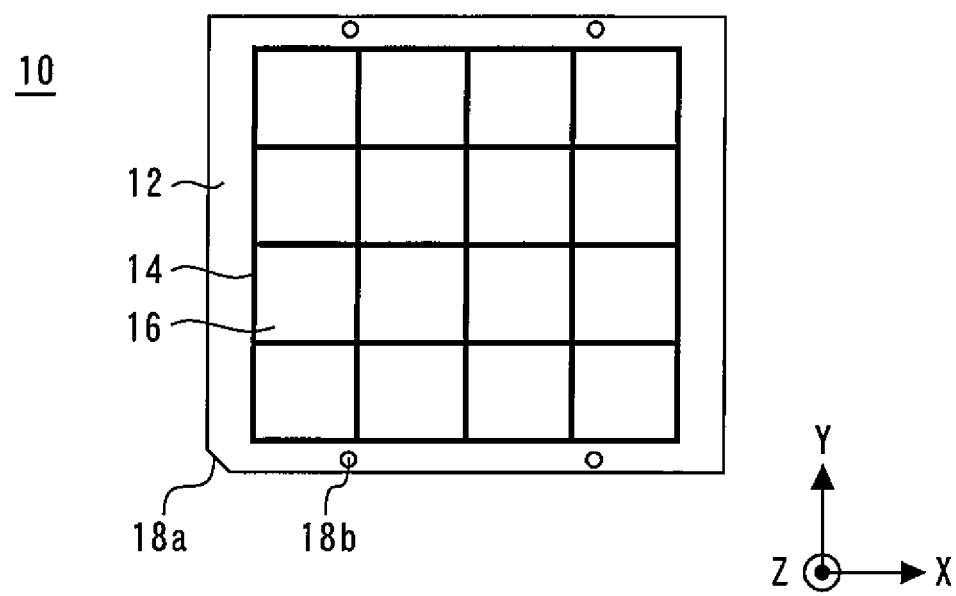
FIG. 1 is a plan view of a jig of the first embodiment.

A foreign matter removal device and foreign matter removal method in accordance with a first embodiment of the present invention are designed to remove foreign matter adhering to semiconductor chips. FIG. 1 is a plan view of a jig of the first embodiment. The jig 10 includes a plate 12 and a frame 14 secured onto the plate 12. The plate 12 is formed, e.g., of conductive material such as aluminum. The frame 14 is configured to accommodate a plurality of semiconductor chips in spaced relationship. The frame 14 is formed of insulating material such as PPS resin to prevent electrical conduction between the plurality of semiconductor chips.

The semiconductor chips are mounted on the regions of the plate 12 which are defined and surrounded by the frame 14, and these regions are referred to herein as the mounting sections 16. The mounting sections 16 have been subjected to cleaning and grinding for removing burrs and projections therefrom so that the surfaces of the mounting sections 16 are flat and smooth and the semiconductor chips can be mounted on the mounting sections 16 without damage to the bottom surfaces of the chips. It should be noted that a cut face 18a and holes 18b are formed in the peripheral portion of the plate 12 and serve as positioning means for the plate 12.

Figure 2:
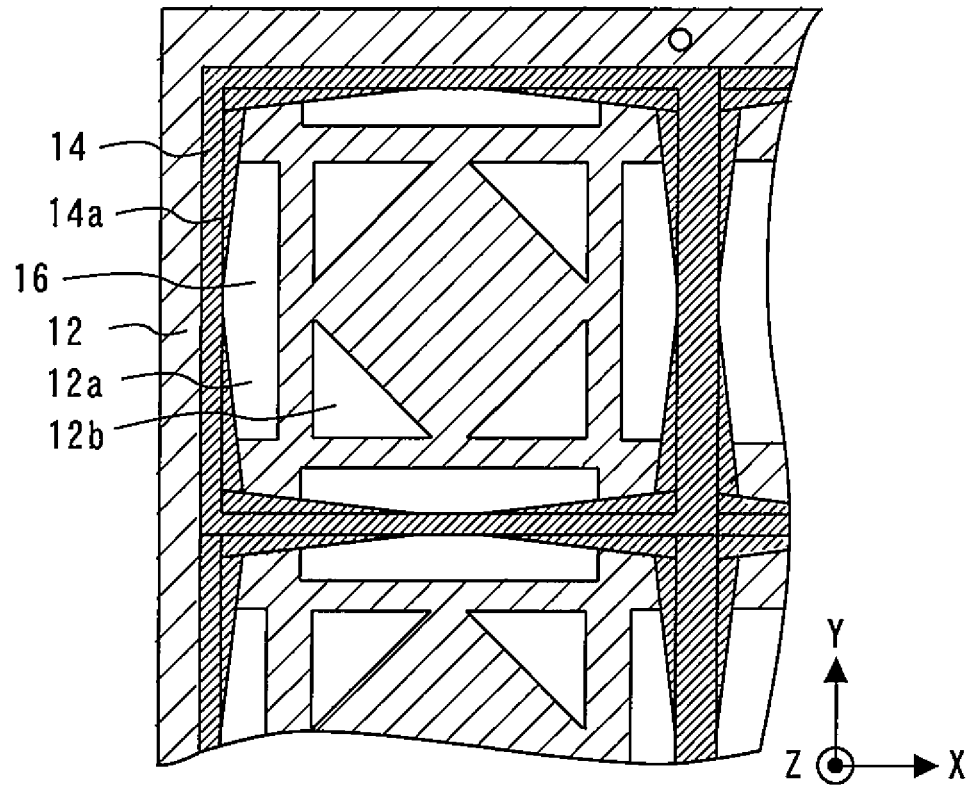
FIG. 2 is an enlarged view of a portion of FIG. 1.

FIG. 2 is an enlarged view of a portion of FIG. 1. The plate 12 has through-holes 12a and through-holes 12b formed therein. Specifically, through-holes 12a and 12b are formed in each region (or mounting section 16) of the plate 12 defined and surrounded by the frame 14. The through-holes 12a are formed in the peripheral portions of the mounting section 16 adjacent to sides of the frame 14, as viewed in plan. The through-holes 12b, on the other hand, are formed at the central portion of the mounting section 16 and are not adjacent to the sides of the frame 14. The frame 14 has recessed portions 14a serving as side portions thereof. As a result, each mounting section 16 of the plate 12 is surrounded by 8 sides of the frame 14.

Figure 3:
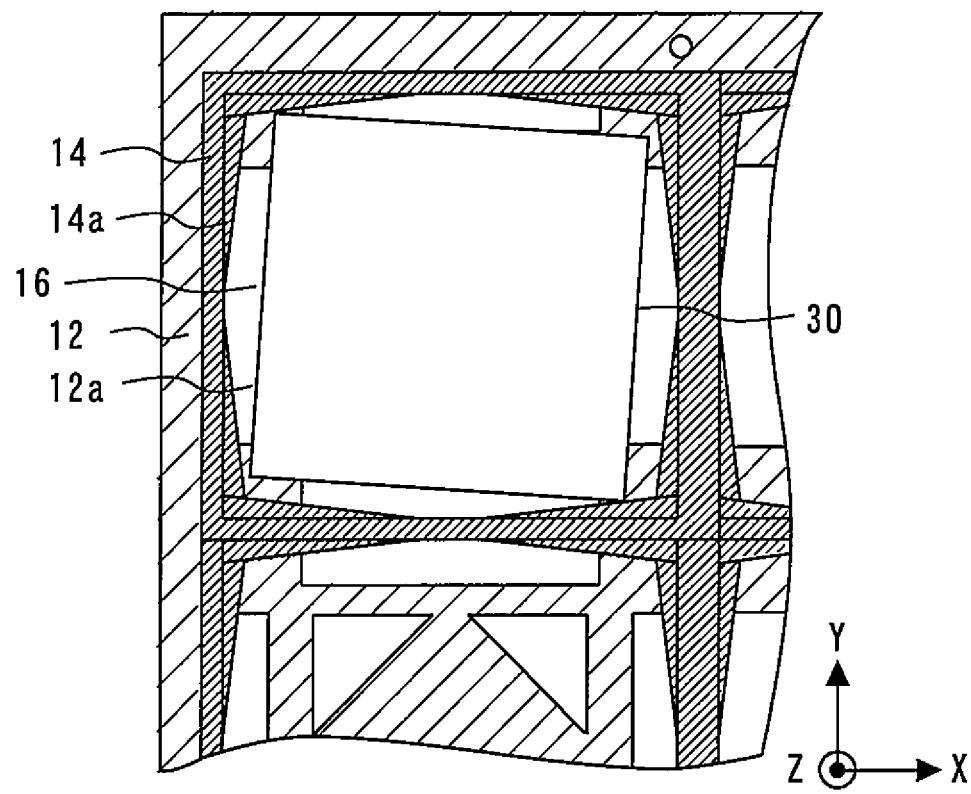
FIG. 3 is a diagram showing a semiconductor chip mounted on the plate.

FIG. 3 is a diagram showing a semiconductor chip mounted on the plate. Specifically, the semiconductor chip 30, which is rectangular as viewed in plan, is placed on a mounting section 16 of the plate 12. The semiconductor chip 30 has a vertical structure which has an electrode formed on its top and bottom surfaces. Since the plate 12 has the through-holes 12a and 12b formed therein, the bottom surface of the semiconductor chip 30 is externally exposed through these through-holes. Further, since the semiconductor chip 30 is rectangular, it does not come into surface contact with the 8 sides of the frame 14 which surround the mounting section 16.

Figure 4:
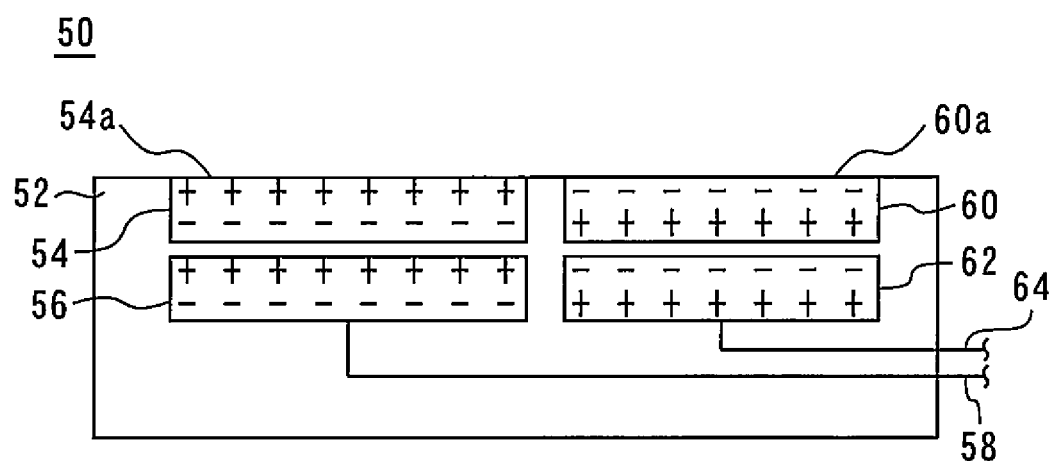
FIG. 4 is a cross-sectional view of a foreign matter capture member provided in the foreign matter removal device of the first embodiment.

FIG. 4 is a cross-sectional view of a foreign matter capture member provided in the foreign matter removal device of the first embodiment. The foreign matter capture member 50 has a first charge section 54 and a second charge section 60 which are provided in a base substrate 52 of insulating material. The first charge section 54 and the second charge section 60 are insulated from each other, since the base substrate 52 extends between these charge sections. The surface of the first charge section 54, which is referred to herein as the first flat surface 54a, and the surface of the second charge section 60, which is referred to herein as the second flat surface 60a, are externally exposed. The first flat surface 54a and the second flat surface 60a constitute portions of a single flat surface.

The base substrate 52 has formed therein a first electrode 56 and a second electrode 62 which are used as charging means. The first electrode 56 is formed below the first charge section 54, and the second electrode 62 is formed below the second charge section 60. The first electrode 56 is provided to positively charge the first flat surface 54a. The second electrode 62 is provided to negatively charge the second flat surface 60a. A wire 58 is connected to the first electrode 56, and a wire 64 is connected to the second electrode 62.

Figure 5:
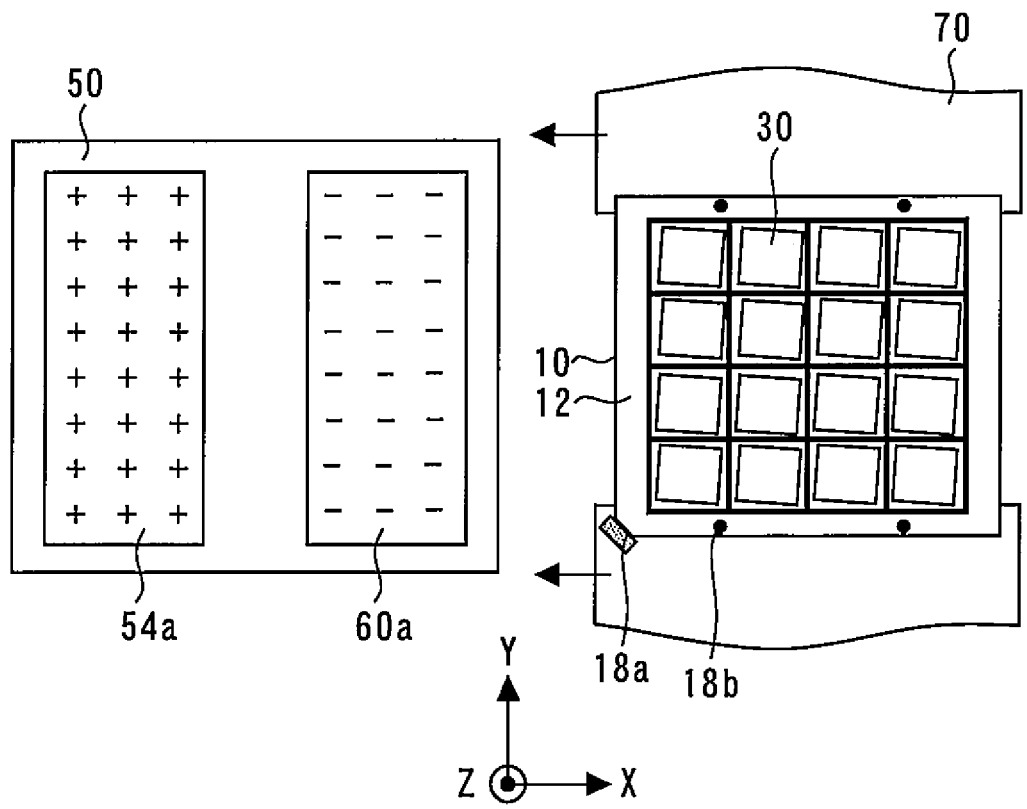
FIG. 5 is a diagram showing the method of removing foreign matter in accordance with the first embodiment.

A method of removing foreign matter in accordance with the first embodiment winnow be described. FIG. 5 is a diagram showing the method of removing foreign matter in accordance with the first embodiment. First, semiconductor chips 30 are mounted on the plate 12 of the jig 10 in such a manner that the bottom surfaces of the semiconductor chips 30 are exposed through the through-holes 12a and 12b.

Next, the first flat surface 54a of the first charge section 54 is positively charged by means of the first electrode 56 serving as charging means, and the second flat surface 60a of the second charge section 60 is negatively charged by means of the second electrode 62. This process is referred to herein as the charging process.

After the charging process, the jig 10 is caused to slide relative to the foreign matter capture member 50. This process is referred to herein as the sliding process. The sliding process is accomplished by means of a moving jig 70 serving as sliding means. First, the jig 10 is secured to the moving jig 70 at a predetermined location by use of the cut face 18a and the holes 18b which serve as positioning means. Next, the moving jig 70 with the jig 10 secured thereto is moved so that the jig 10 slides relative to the foreign matter capture member 50 in such a manner that the through-holes 12a and 12b of the jig 10 face and are spaced a predetermined distance from the first flat surface 54a and the second flat surface 60a. That is, the moving jig 70 is moved in the direction of the arrows of FIG. 5.

Figure 6:
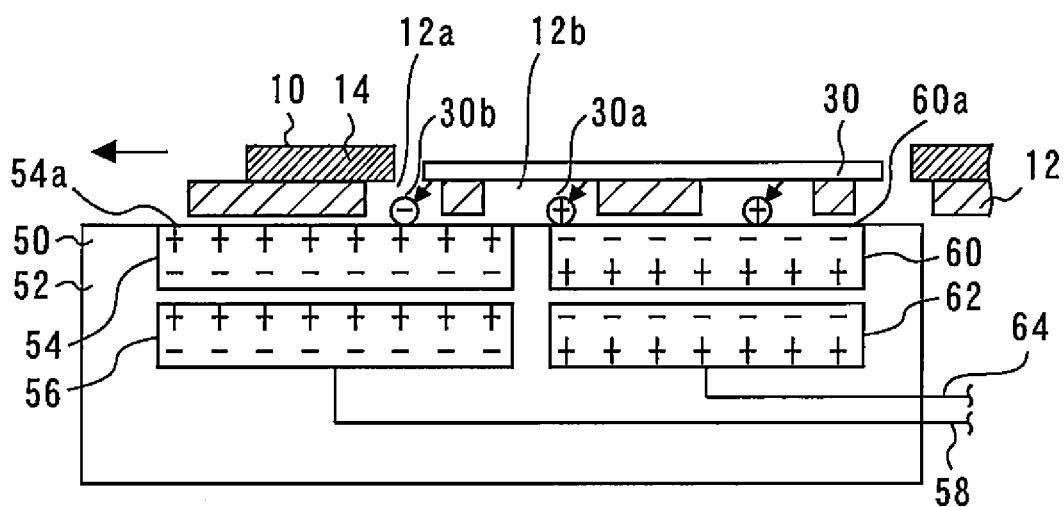
FIG. 6 is a cross-sectional view showing the way in which the jig is caused to slide along above the foreign matter capture member by the sliding means.

FIG. 6 is a cross-sectional view showing the way in which the jig is caused to slide along above the foreign matter capture member by the sliding means. The bottom surfaces of the semiconductor chips 30 mounted on the jig 10 face and are spaced a predetermined distance from the first flat surface 54a and the second flat surface 60a. Positively charged foreign matter 30a adhering to the semiconductor chips 30 is electrostatically attracted and adhered to the negatively charged second flat surface 60a through the through-holes 12b. Negatively charged foreign matter 30b adhering to the semiconductor chips 30 is electrostatically attracted and adhered to the positively charged first flat surface 54a through the through-holes 12a. Thus, the foreign matter adhering to the semiconductor chips 30 is electrostatically attracted and adhered to the first flat surface 54a and the second flat surface 60a through the through-holes 12a and 12b.

Incidentally, semiconductor chips are produced by dicing (or splitting) a semiconductor wafer which has been subjected to a plurality of processes. It may happen that foreign matter adheres to the semiconductor wafer during these processes, or foreign matter adheres to the sides of the semiconductor chips during the dicing process. Particularly, dicing generates a large amount of scraps, chippings, etc. of semiconductor wafer material, which are referred to herein as "foreign matter." Such foreign matter may adhere to the semiconductor chips. The foreign matter adhering to the semiconductor chips readily becomes charged due to friction or contact and therefore is thought to be in a charged state.

Foreign matter causes various problems. For example, foreign matter adhering to surface pads of a semiconductor chip may cause short circuiting or electrical discharge. Further, in the case of semiconductor chips having a vertical structure wherein a current flows between the top surface and the bottom surface of the structure, the bottom surface side of the chip as well as the top surface side is used as an electrode. Therefore, if foreign matter adheres to the bottom surface of the chip, the contact resistance between the semiconductor chip and external electrodes increases. Further, the presence of foreign matter may result in the formation of defects, such as cracks, in the semiconductor chip and in the parts in contact with or adjacent the semiconductor chip, thereby damaging the semiconductor chip.

In the foreign matter removal device and foreign matter removal process of the first embodiment, since the bottom surfaces of the semiconductor chips 30 are externally exposed through the through-holes 12a and 12b, charged foreign matter adhering to these bottom surfaces can be attracted and adhered to the foreign matter capture member 50. Further, since the semiconductor chips 30 are rectangular, their sides do not come into surface contact with the 8 sides of the frame 14 which surround each mounting section 16. As a result, it is possible to prevent foreign matter from being caught between these sides of the frame 14 and the sides of the semiconductor chips 30, in which case it would be difficult to remove the foreign matter. Further, since the through-holes 12a are formed adjacent to sides of the frame 14, as viewed in plan, the foreign matter capture member 50 can be used to attract and capture, through the through-holes 12a, the foreign matter on and near the sides of the semiconductor chips 30, as well as the foreign matter on the frame 14 which otherwise might adhere to the sides of the semiconductor chips 30. It is also possible to prevent foreign matter from remaining on the plate 12.

Further, in the sliding process, the bottom surfaces of the semiconductor chips 30 and the through-holes 12a and 12b are spaced a predetermined distance from the first flat surface 54a and the second flat surface 60a, so that the foreign matter that has been electrostatically attracted and adhered to these flat surfaces can be prevented from adhering to the semiconductor chips 30 again.

Since the plate 12 of the jig 10 is formed of conductive material, the jig 10 can be used in the test process for measuring the electrical characteristics of the semiconductor chips 30. Therefore, after performing the above-described foreign matter removal method, the jig 10 may be used to carry the semiconductor chips 30 and then used to measure the electrical characteristics of the semiconductor chips 30. It should be noted that the plate 12 of the jig 10 need not be formed of conductive material if the jig 10 is used for semiconductor chips having a lateral structure wherein electrode pads are provided only on the top surface of the chip.

Although in the foreign matter removal method of the first embodiment the jig 10 is caused to slide relative to the foreign matter capture member 50, it is to be understood that the present invention is not limited to this particular embodiment. For example, since the foreign matter on the semiconductor chips 30 can be electrostatically attracted and adhered to the first flat surface 54a and the second flat surface 60a if these flat surfaces are in close proximity to the bottom surfaces of the semiconductor chips 30, the foreign matter capture member 50 may be caused to slide relative to the jig 10. That is, either the jig 10 or the foreign matter capture member 50 may be caused to slide relative to the other.

The recessed portions 14a of the frame 14 are formed in order to prevent surface contact between the sides of the frame 14 and the sides of the semiconductor chips 30. Therefore, each mounting section 16 on which a semiconductor chip 30 is mounted need not necessarily be defined or surrounded by 8 sides of the frame 14, but may be defined or surround by any number of sides of the frame 14 if the resulting configuration of these sides of the frame 14 prevents surface contact between the sides of the semiconductor chip 30 and these sides of the frame 14.

The charging means for charging the first flat surface 54a and the second flat surface 60a is not limited to the first electrode 56 and the second electrode 62, but any suitable charging means capable of such charging operation may be used. For example, the charging means may be a charging member which charges the first flat surface 54a and the second flat surface 60a by means of contact, friction, or rolling. Various other alterations may be made to the first embodiment without departing from the features of the present invention.

Second Embodiment

A foreign matter removal device and foreign matter removal method in accordance with a second embodiment of the present invention differ from those of the first embodiment in that they use a different charging means than that of the first embodiment. Other features of the second embodiment are the same as those of the first embodiment and will not be described herein.

Figures 7, 8:
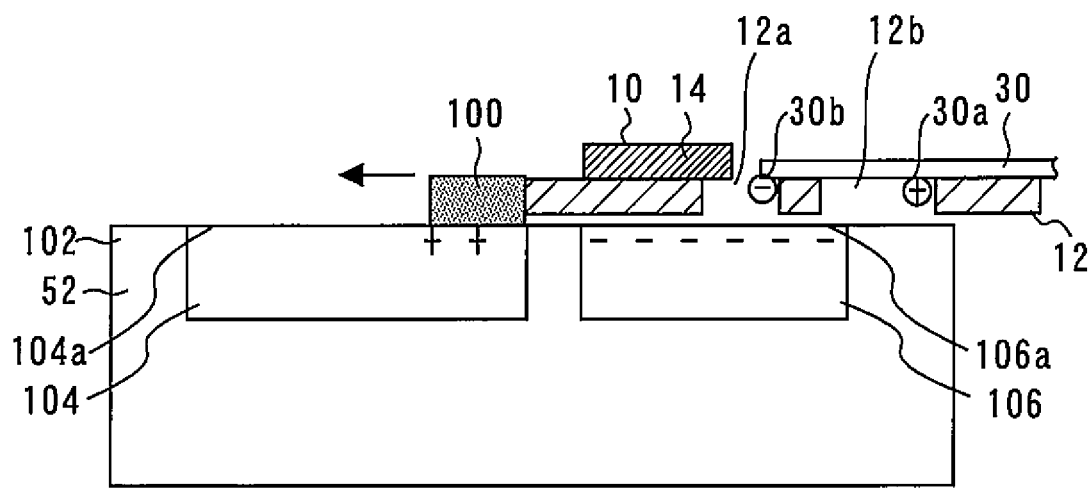
FIG. 7 is a cross-sectional view showing the foreign matter removal method of the second embodiment.
FIG. 8 is a table showing the triboelectric series.

A charging member serving as charging means of the second embodiment is secured to the jig 10. FIG. 7 is a cross-sectional view showing the foreign matter removal method of the second embodiment. The charging member 100 is secured to the leading portion of the jig 10. The first charge section 104 and the second charge section 106 of a foreign matter capture member 102 are formed of different materials selected from the triboelectric series. FIG. 8 is a table showing the triboelectric series. The first charge section 104 is formed of a material on the positive side of the triboelectric series, and the second charge section 106 is formed of a material on the negative side of the series. The charging member 100 is formed of a material having a position in the triboelectric series between the materials of the first charge section 104 and the second charge section 106.

When the jig 10 is caused to slide relative to the foreign matter capture member 102 in the manner shown in FIG. 7, the charging member 100 secured to the leading portion of the jig 10 first comes into contact with the second flat surface 106a, so that the second flat surface 106a is negatively charged. The charging member 100 then comes into contact with the first flat surface 104a, so that the first flat surface 104a is positively charged.

Figure 9:
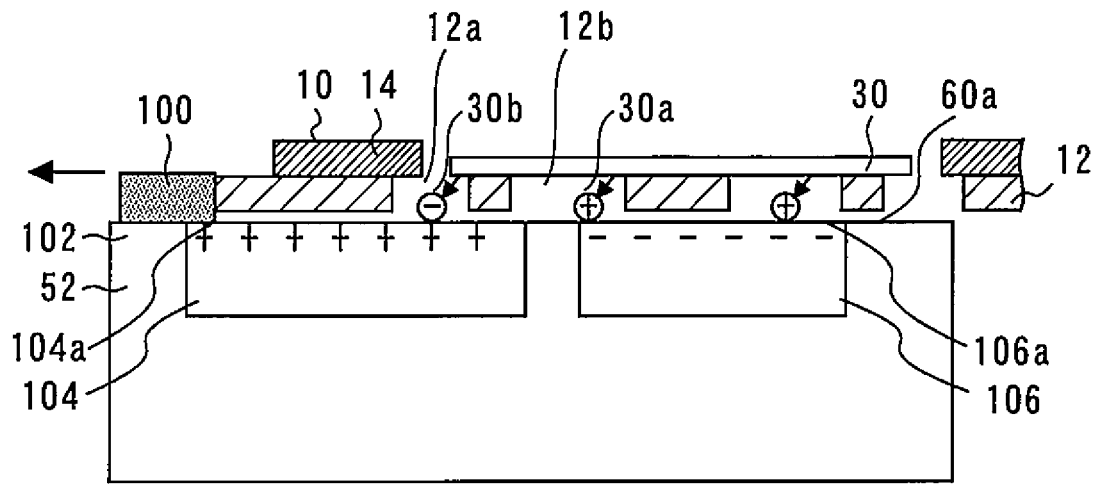
FIG. 9 is a cross-sectional view showing the method of removing foreign matter in accordance with the second embodiment.

FIG. 9 is a cross-sectional view showing the method of removing foreign matter in accordance with the second embodiment. As in the first embodiment, the jig 10 is caused to slide relative to the foreign matter capture member 102 so that positively foreign matter 30a adhering to the semiconductor chips 30 is electrostatically attracted and adhered to the second flat surface 106a, and negatively charged foreign matter 30b is electrostatically attracted and adhered to the first flat surface 104a.

In the foreign matter removal device and foreign matter removal method in accordance with the present embodiment, the charging member 100 is formed of a material having a position in the triboelectric series between the materials of the first charge section 104 and the second charge section 106. Therefore, the first flat surface 104a and the second flat surface 106a can be charged merely by causing the charging member 100 to slide relative to the foreign matter capture member 102 once. As a result, there is no need for the first and second electrodes of the first embodiment, making it possible to simplify the configuration of the foreign matter removal device and the foreign matter removal method. It should be noted that the foreign matter removal device and foreign matter removal method of the second embodiment are susceptible of alterations at least similar to those that can be made to the foreign matter removal device and foreign matter removal method of the first embodiment.

Third Embodiment

A foreign matter removal device and foreign matter removal method in accordance with a third embodiment of the present invention are characterized in that the foreign matter capture member is cleaned after the removal of foreign matter on the semiconductor chips. Other features of the third embodiment are the same as those of the first embodiment and will not be described herein.

Figure 10:
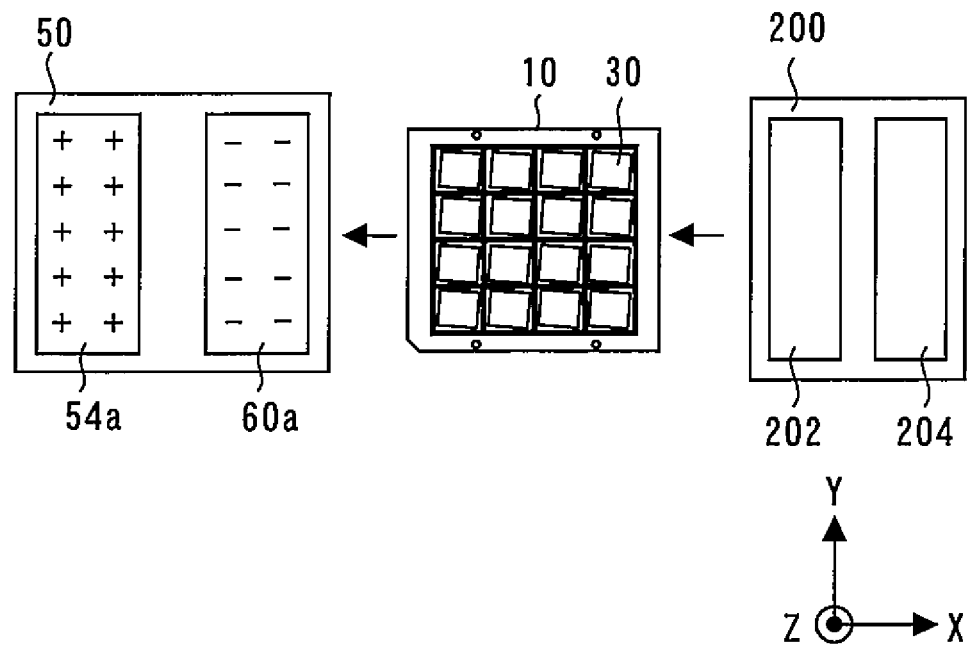
FIG. 10 is a diagram conceptually showing the foreign matter removal method of the third embodiment.

FIG. 10 is a diagram conceptually showing the foreign matter removal method of the third embodiment. First, foreign matter is electrostatically attracted and adhered to the surface of the foreign matter capture member 50 by causing the jig 10 to slide relative to the foreign matter capture member 50. Next, the foreign matter adhering to the foreign matter capture member 50 is collected by a cleaner 200. The cleaner 200 includes an ionizer 202. The ionizer 202 is used to emit negative and positive ions so as to electrically neutralize the foreign matter adhering to the first flat surface 54a and the second flat surface 60a. The cleaner 200 also includes a collecting means 204. The collecting means 204 collects by suction the foreign matter which has been neutralized by the ionizer 202.

Figure 11:
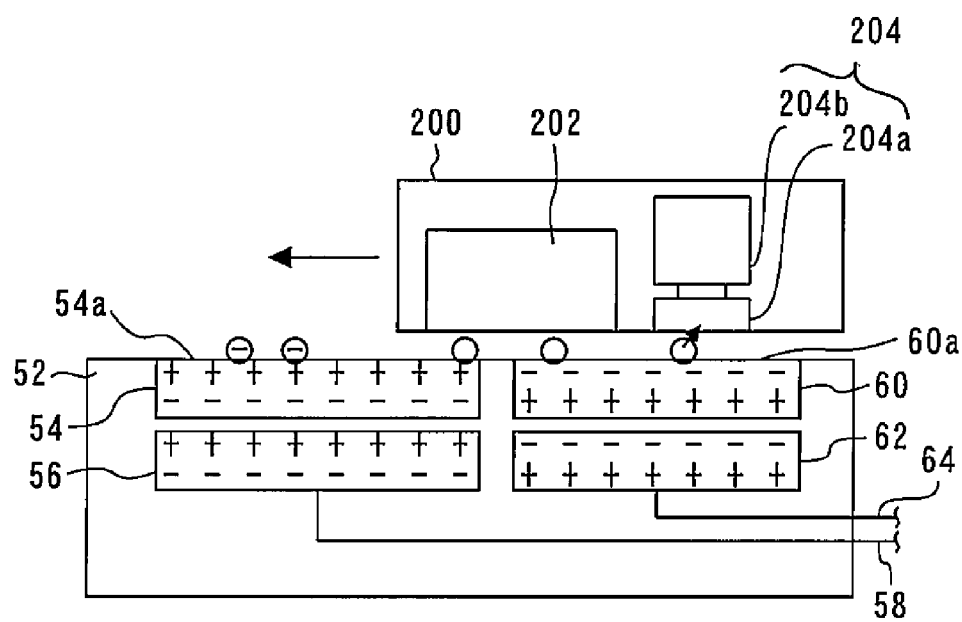
FIG. 11 is a cross-sectional view showing the way in which the foreign matter capture member is cleaned by the cleaner.

FIG. 11 is a cross-sectional view showing the way in which the foreign matter capture member is cleaned by the cleaner. After the sliding process described above, the cleaner 200 is caused to slide along the first flat surface 54a and the second flat surface 60a. During this sliding movement, the ionizer 202 is caused to emit negative and positive ions so as to neutralize the foreign matter electrostatically adhering to the first flat surface 54a and the second flat surface 60a. The collecting means 204 then collects the neutralized foreign matter by suction. Specifically, the neutralized foreign matter is sucked through a suction inlet 204a provided with, e.g., a revolving fan, and then is trapped by a foreign matter removal filter 204b.

The foreign matter removal device and foreign matter removal method of the third embodiment make it possible to initiate the removal of the foreign matter on the semiconductor chips 30 after the first flat surface 54a and the second flat surface 60a are cleaned of foreign matter. Therefore, the foreign matter that has been electrostatically attracted and adhered to the foreign matter capture member 50 can be prevented from adhering to the semiconductor chips 30 again. It should be noted that the foreign matter removal filter 204b is replaced when its foreign matter trapping capability has decreased as a result of a considerable amount of foreign matter being trapped in the filter 204b.

Although in the present embodiment the ionizer 202 is used as neutralizing means, it is to be understood that humidifying means or heating means can be used to neutralize charged foreign matter. Further, a plurality of neutralizing means may be used to effectively neutralize charged foreign matter. The cleaner 200 may be applied to the foreign matter capture member 102 of the second embodiment or other foreign matter capture members. It should be noted that the foreign matter removal device and foreign matter removal method of the third embodiment are susceptible of alterations at least similar to those that can be made to the foreign matter removal device and foreign matter removal method of the first embodiment.

The present invention makes it possible to remove foreign matter on the side and bottom surfaces of semiconductor chips.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-015276, filed on Jan. 27, 2012 including specification, claims, drawings and summary, on which the Convention priority of the present application is based, are incorporated herein by reference in its entirety.

What is claimed is:

1. A foreign matter removal device comprising:
   a jig having a plate with through-holes formed therein and also having a frame formed on said plate so as to be able to accommodate a plurality of semiconductor chips in spaced relationship on at least a first portion of a top surface of said plate and laterally between interior side surfaces of said frame;
   a foreign matter capture member having a first charge section with a first flat surface and a second charge section with a second flat surface, said second charge section being insulated from said first charge section, said first and second flat surfaces constituting a single flat surface;
   charging means for positively charging said first flat surface and negatively charging said second flat surface; and
   sliding means for causing either said jig or said foreign matter capture member to slide relative to the other in such a manner that said through-holes of said jig are spaced a predetermined distance from said first and second flat surfaces;
   wherein said through-holes are formed in different regions defined and surrounded by said frame,
   wherein at least a portion of a bottom surface of said frame is formed on at least a second portion of said top surface of said plate, and
   wherein the frame has a plurality of openings, wherein each opening is provided for each of the plurality of semiconductor chips, wherein each opening has a plurality of recessed portions, wherein the plurality of recessed portions define said interior side surfaces of the frame facing each semiconductor chip, and wherein the plurality of recessed portions define a shape of each opening in plan view that is not rectangular.

2. The foreign matter removal device according to claim 1, wherein said plate is formed of conductive material.

3. The foreign matter removal device according to claim 1, wherein:
   said semiconductor chips are rectangular as viewed in plan; and
   a configuration of sides of said frame prevents surface contact between said sides of said frame and sides of said semiconductor chips when said semiconductor chips are accommodated in said frame.

4. The foreign matter removal device according to claim 3, wherein said through-holes are formed adjacent said sides of said frame as viewed in plan.

5. The foreign matter removal device according to claim 1, wherein said charging means has a first electrode formed below said first charge section and a second electrode formed below said second charge section.

6. The foreign matter removal device according to claim 1, wherein said charging means is a charging member for charging said first and second flat surfaces by means of contact, friction, or rolling.

7. The foreign matter removal device according to claim 6, wherein said charging member is secured to said jig.

8. The foreign matter removal device according to claim 6, wherein said first and second charge sections are formed of different materials selected from a triboelectric series, and said charging member is formed of the material having a position in the triboelectric series between said materials of said first and second charge sections.

9. The foreign matter removal device according to claim 1, further comprising:
   neutralizing means for electrically neutralizing foreign matter adhering to said first and second flat surfaces; and
   collecting means for collecting foreign matter that has been electrically neutralized by said neutralizing means.

* * * * *